(12) United States Patent
Guenther

(10) Patent No.: US 11,624,781 B2
(45) Date of Patent: Apr. 11, 2023

(54) NOISE-COMPENSATED JITTER MEASUREMENT INSTRUMENT AND METHODS

(71) Applicant: Tektronix, Inc., Beaverton, OR (US)

(72) Inventor: Mark L. Guenther, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/695,633

(22) Filed: Mar. 15, 2022

(65) Prior Publication Data

US 2022/0299566 A1   Sep. 22, 2022

Related U.S. Application Data

(60) Provisional application No. 63/161,937, filed on Mar. 16, 2021.

(51) Int. Cl.
*G01R 31/28* (2006.01)
*G01R 31/317* (2006.01)
(Continued)

(52) U.S. Cl.
CPC .  *G01R 31/31713* (2013.01); *G01R 31/31709* (2013.01); *G01R 31/31917* (2013.01); *G01R 31/318342* (2013.01)

(58) Field of Classification Search
CPC ........ G01R 31/31713; G01R 31/31709; G01R 31/318342; G01R 31/31917
See application file for complete search history.

(56) References Cited

U.S. PATENT DOCUMENTS 7,516,030 B2    4/2009  Miller
8,594,169 B2   11/2013  Zivny et al.
(Continued)

FOREIGN PATENT DOCUMENTS

KR   10-2008-0016964    2/2008

OTHER PUBLICATIONS

Korean Intellectual Property Office, International Search Report and Written Opinion for International Application No. PCT/US2022/020438, 9 pages, dated Jul. 4, 2022, Daejeon, Republic of Korea.

*Primary Examiner* — Christine T. Tu
(74) *Attorney, Agent, or Firm* — Miller Nash LLP; Andrew J. Harrington

(57) ABSTRACT

A test and measurement device includes an input for receiving a test waveform from a Device Under Test (DUT), where the test waveform has a plurality of input level transitions, a selector structured to respectively and individually extract only those portions of the test waveform that match two or more predefined patterns of input level transitions of the test waveform, a noise compensator structured to individually determine and remove, for each of the extracted portions of the waveform, a component of a jitter measurement caused by random noise of the test and measurement device receiving the test waveform, a summer structured to produce a composite distribution of timing measurements with removed noise components from the extracted portions of the test waveform, and a jitter processor structured to determine a first noise-compensated jitter measurement of the DUT from the composite distribution. Methods of determining noise-compensated jitter measurements are also disclosed.

21 Claims, 8 Drawing Sheets

(51) Int. Cl.
    *G01R 31/3183*    (2006.01)
    *G01R 31/319*     (2006.01)

(56) References Cited

U.S. PATENT DOCUMENTS

| | | | |
|---|---|---|---|
| 8,891,602 B1 | 11/2014 | Giust | |
| 9,294,237 B2 | 3/2016 | Guenther et al. | |
| 2002/0136337 A1* | 9/2002 | Chatterjee | H04L 1/205 375/355 |
| 2004/0062301 A1* | 4/2004 | Yamaguchi | H04B 7/01 375/226 |
| 2008/0247451 A1* | 10/2008 | Yamaguchi | H03M 1/0836 375/226 |

\* cited by examiner

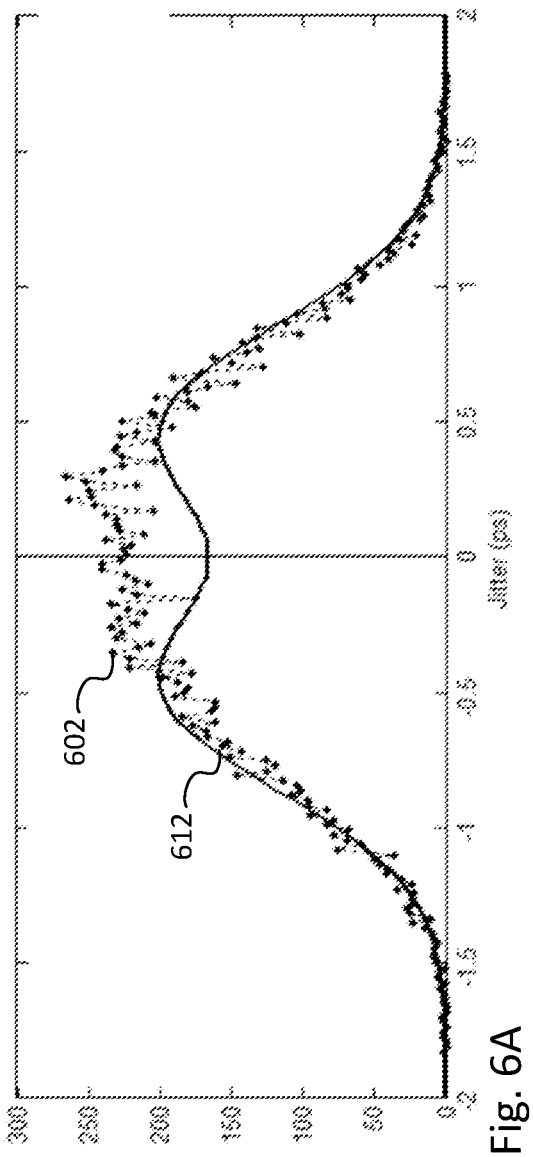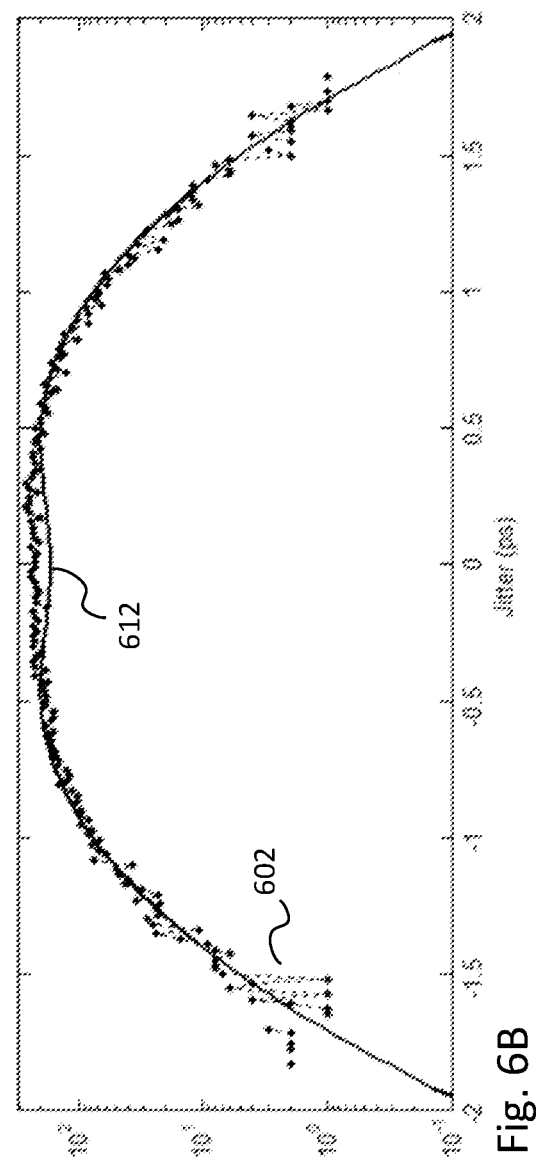
Fig. 6A
Fig. 6B

NOISE-COMPENSATED JITTER MEASUREMENT INSTRUMENT AND METHODS

PRIORITY

This disclosure claims benefit of U.S. Provisional Application No. 63/161,937, titled "APPARATUS AND METHOD FOR ACCURATELY EXTRAPOLATING J6U AND JRMS MEASUREMENTS WITH NOISE COMPENSATION," filed on Mar. 16, 2021, which is incorporated herein by reference in its entirety.

FIELD OF THE INVENTION

This disclosure is directed to systems and methods related to test and measurement systems, and in particular, to a test and measurement instrument that can accurately quantify a jitter component of an input signal.

BACKGROUND

Many modern electronic devices and communication systems transfer digital information from a transmitter to a receiver across a channel using a serialized stream of digital data bits. It can be of great interest of users to measure the quality of the transmitted or received signal to predict error rates. In particular, jitter analysis refers to the process of measuring the displacement in time of each rising or falling waveform edge from its ideal position, which is jitter, and then analyzing the jitter to identify distinct subcomponents, either for the purposes of predicting bit error rate or developing or debugging an electronic circuit.

One issue in analyzing jitter of an input signal is that the measuring instrument creates and introduces noise as part of its processing of the input signal, prior to any jitter analysis of the input signal itself. This noise affects the apparent positions of the waveform transitions that determine jitter. Thus, analyzing the processed input signal for jitter does not isolate the device being tested, because jitter from the Device Under Test (DUT) and noise from the measurement instrument are combined. And, eliminating instrument noise is difficult as the instrument noise biases the measured jitter on each transition, and the bias itself is correlated to the slew rate of a specific edge of a particular symbol sequence in the input signal. In other words, the instrument noise impacts each transition differently, which means instrument noise cannot be simply subtracted out of the combined noise to analyze the input signal for jitter.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which:

FIGS. 6A and 6B illustrate a result of fitting a set of dual-dirac parameters that models behavior of a distribution of a set of measured data using a q-scale plot, as performed in embodiments of the invention.

DESCRIPTION

Figure 1:
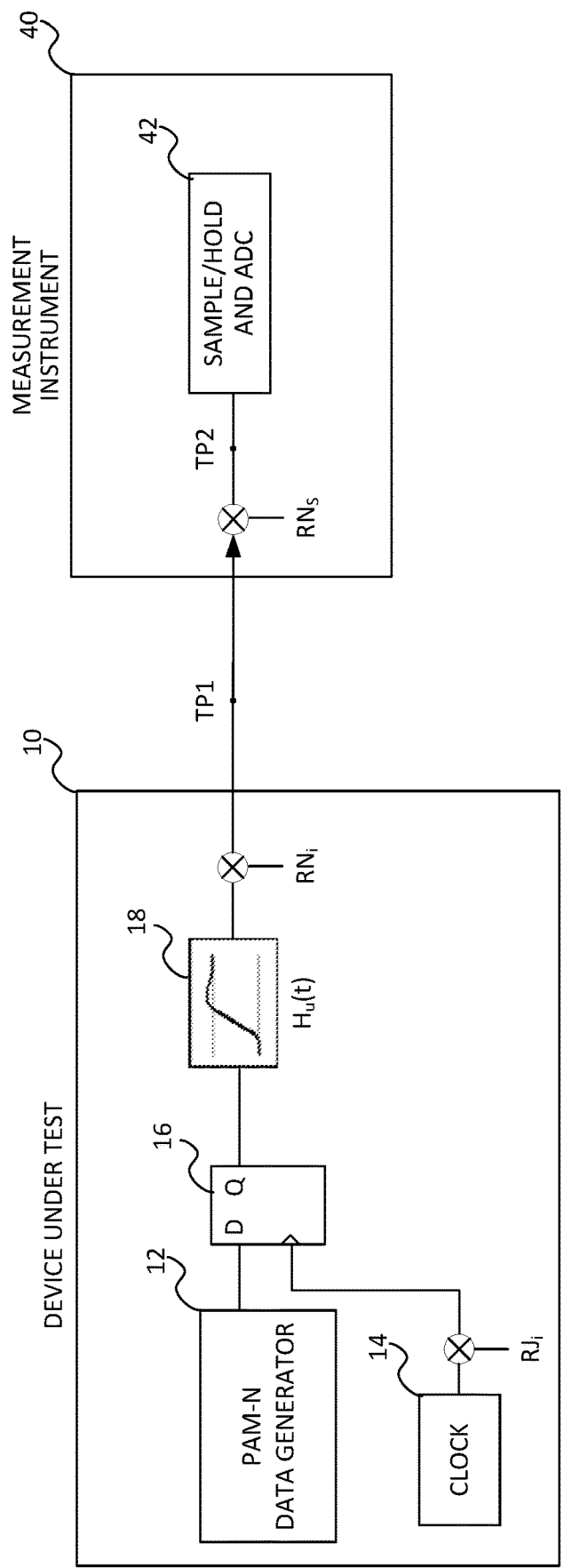
FIG. 1 is a block diagram model of jitter in a conventional test and measurement system having a Device Under Test (DUT) and a measurement instrument.

As mentioned above, conventional jitter analysis methods fail to compensate for noise of the measuring instrument when making measurements of a Device Under Test. There are several equivalent ways in which the jitter values can be expressed. One way uses the measurements Jrms and JNu. Jrms is defined as the root-mean-squared value of all uncorrelated jitter in the waveform. JNu, where N is an integer, is defined as the range of uncorrelated jitter values that excludes the lowest $(1*10^{-N})/2$ observations, and also excludes the highest $(1*10^{-N})/2$ observations, so that only the central $1-1*10^{-N}$ observed values remain. The uncorrelated jitter is defined as the jitter remaining after deterministic jitter that is correlated to the data pattern is subtracted out. Sometimes this deterministic jitter correlated to the data pattern is referred to as Data Dependent Jitter (DDJ). Jrms and JNu have appeared in Ethernet (IEEE 802.3) as well as other high-speed serial standards, and were used internally by the PCI-SIG (Peripheral Component Interface Special Interest Group) for the purposes of studying and specifying jitter. In development of the PCIe Gen 6 standard, the development group specifically used a jitter measurement JNu, where N=6, i.e., J6u, and explored several ways of compensating for instrument noise. The PCIe standard, however, is not explicit with respect to how such measurements are to be made. Embodiments of the invention provide noise compensated jitter measurements that allow such measurement to be made, and, indeed, allow the user great control in the accuracy of noise-compensated jitter measurement for data standards as well as for general testing of devices.

Jitter compliance values, such as those used in PCIe, can be expressed in terms of Jrms and JNu, which were introduced above.

$$T_{TX-UTJ} = J6u \qquad \text{Equation (1):}$$

$$T_{TX-UDJDD} = \frac{J6u + 2Q_6\sqrt{Jrms^2(1+Q_6^2) - \frac{J6u^2}{4}}}{1+Q_6^2} \qquad \text{Equation (2)}$$

where $Q_6 = 4.8916$ $$T_{TX-RJ} = \sqrt{Jrms^2 - \left(\frac{T_{TX-UDJDD}}{2}\right)^2} \qquad \text{Equation (3)}$$

When making measurements for PCIe Gen 6 compliance purposes, the DUT transmits a defined cyclic pattern of 52 PAM4 (Pulsed Amplitude Modulation, 4-Level) symbols with 48 transitions. For various reasons, it is useful to make these or similar measurements on other patterns, or on an arbitrary sequence of symbols with no repeating pattern, for example when a physical device under development is not yet configurable to produce the exact 52-symbol pattern specified in the PCIe standard. Embodiments of the invention allow a user to define any pattern or series of patterns on which to perform the measurements, as described herein. Using embodiments of the invention allows a user to quickly perform the desired jitter measurements for PCIe Gen 6, as well as other various data communication standards.

In the following description, "noise" refers to unintended or unexpected variations in a signal parameter. When the parameter is time, which may be absolute or delta values, the more specific term "jitter" is generally used. When the parameter is voltage, the terms "voltage noise", "vertical noise" or just "noise" may be used, where the final case should be clear by context. "Voltage" is used to represent the dependent parameter measured by an instrument, such as an oscilloscope, although the actual parameter could be current, optical magnitude or some other value depending on the type of probe used.

RJ, Random Jitter, is the standard deviation of Gaussian random timing variation. Similarly, RN, which means Random Noise, is the standard deviation of Gaussian random voltage variations. The standard deviation may also be represented by "sigma" or σ.

The terms "transition" and "edge" may be used interchangeably and refer to the amplitude transition of a signal in a sequence of symbols from one nominal level to another different level, which takes place over some non-zero time interval, and therefore with non-infinite slew rate.

FIG. 1 is a block diagram model of jitter and noise in a conventional test and measurement system having a Device Under Test (DUT) 10 and a measurement instrument 40, such as an oscilloscope.

In this model of FIG. 1, RJi represents the standard deviation of the intrinsic jitter in the DUT 10, meaning random modulation of the clock source that has no relation to any amplitude effects of the test signal produced by the DUT. After being modulated in time by a D flip-flop 16, pure data symbols from a PAM-N generator 12 are converted to signal transitions with finite rise time by $H_{tx}(t)$ 18, which is the unit step response of the transmitter of the DUT 10. Finally, the intrinsic voltage noise of the DUT 10, RNi, is linearly added to the signal before it appears at TP1, the output of the DUT 10. The data generator 12 is labeled as PAM-N, as it produces Pulse Amplitude Modulation symbols of any number N, N=2, 3, 4, etc.

The test signal is received at the measurement instrument 40, or an attached test probe, where $RN_s$ represents additive noise of the instrument 40. $RN_s$ is assumed to be a stationary random variable uncorrelated to any other variable. Both the sources $RJ_i$ and $RN_i$ are legitimately part of the Jrms and J6u values to be characterized, but the $RN_s$ value is not, because it is generated by the instrument 40. $RN_s$ is the single largest contributor of measurement imperfection imposed by the instrument 40. The effects of $RN_s$ should therefore be removed before Jrms and J6u are determined and reported.

Embodiments of the invention include using new operations of data analysis to eliminate the effect from intrinsic random noise of the measurement instrument itself when measuring noise or jitter of a DUT.

Whenever two uncorrelated Gaussian variables X and Y are superimposed, they result in a new Gaussian variable with standard deviation calculated as follows as in Equation 4, below.

$$RJ_{Total} = \sqrt{RJ_X^2 + RJ_Y^2} \qquad \text{Equation (4):}$$

When Gaussian random voltage noise with standard deviation RN operates on a waveform edge k with a slew rate $SR_k$, the standard deviation of the consequent jitter, which is defined as the variation in the time at which the edge crosses a chosen fixed voltage reference, is given as below in Equation 5.

$$RJ_{(v),k} = RN/SR_k \qquad \text{Equation (5):}$$

Combining equations 4 and 5, the total jitter observed on edge k is characterized as set forth in Equation 6.

$$RJ_{Observed,k} = \sqrt{RJ_k^2 + (RN/SR_k)^2} \qquad \text{Equation (6):}$$

Rearranging equation 6 provides an expression for the noise-compensated jitter on edge k as Equation 7.

$$RJ_{Comp,k} = \sqrt{RJ_{Observed,k}^2 - (RN/SR_k)^2} \qquad \text{Equation (7):}$$

If a measurement were desired that only accumulated Time Interval Error (TIE) for edges in a test signal that all had the same slew rate, Equation 7 could be used to calculate the compensated random jitter of the DUT, provided the RN sigma value were known for the measurement instrument. Many test signals, however, include edges that have different slew rates. And, thus, the random jitter of a DUT that sends test signals having different slew rates, which includes PAM-N generating devices where N may be greater than 2, is not directly calculable from Equation 7.

In the case of the PCIe Gen6 pattern, each major PAM4 edge type, such as the 0-to-3 edge, appears four times in each predefined 52-symbol repeat. Technically, each of these four edges is unique, since it has different symbol sequences preceding and following it, compared to the other three 0-to-3 transitions. And each of the four edges of the 0-to-3 edge or any other edge to be tested may have a different slew rate. Indeed, other edge types, such as the 0-to-1 edge in the input test signal are likely to have a dramatically different slew rate than the 0-to-3 edge.

Embodiments of the invention provide an ability to classify or define edges with different characteristics. For example, a template composed of M integers could represent M consecutive transmitted symbols. If PAM4 symbols are represented using the alphabet {0, 1, 2, 3}, a 2-symbol template of [0 3] represents all 0-to-3 transitions. A 4-symbol template of [0 0 0 3] might represent a narrower subset of 0-to-3 transitions, namely those that follow a set of at least three adjacent 0 symbols. Longer templates generally allow greater specificity of pattern, and therefore narrow the range of slew rates represented in the subset.

By combining such specificity of template definitions with compensation for the influence of slew rate and voltage noise on measured jitter, embodiments of the invention can compensate for voltage noise with increased accuracy over any other known method.

Figure 2:
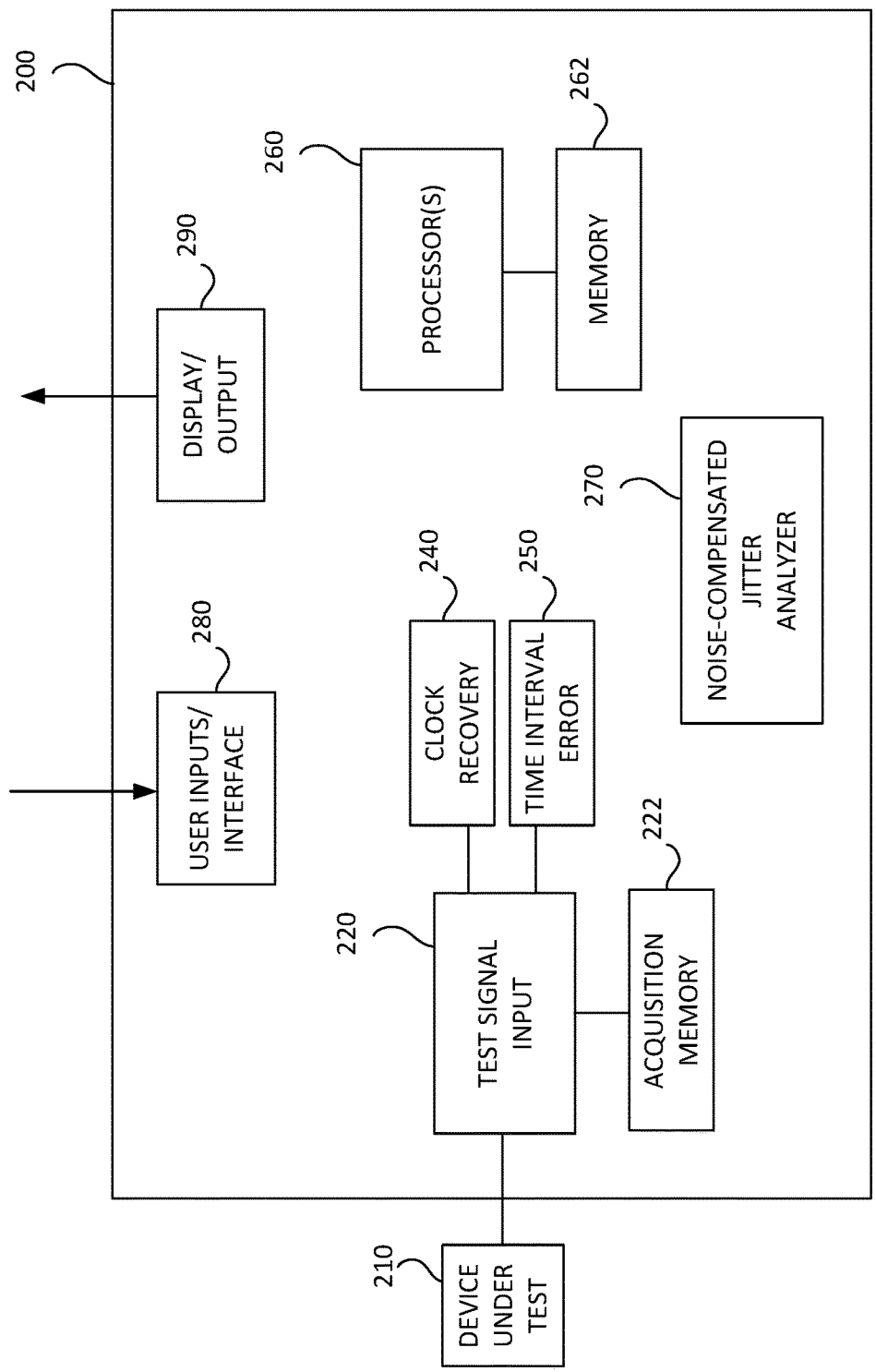
FIG. 2 is an example block diagram of a test and measurement instrument including noise-compensated jitter measurement, according to embodiments of the invention.

FIG. 2 is a block diagram of an example test and measurement instrument 200, such as an oscilloscope, for implementing embodiments of the disclosure disclosed herein. The instrument 200 includes one or more inputs 220, which may be any electrical signaling medium and may act as a testing interface. The signal input 220 receives data from a device under test 210. As described above, the DUT 210 may send PAM-N signals. Clock recovery 240 and Time Interval Error (TIE) 250 are two processes that may be performed on the input signal. The clock recovery process 240 determines the clock period and precise clock edge locations corresponding to the input signal while the TIE process 250 computes the error of the time interval for each edge in the input waveform. The test signal may be stored in an acquisition memory 222 either before or after the clock recovery 240 and TIE process 250 are performed.

A noise-compensated jitter analyzer 270 may include multiple sub-components or sub operations, as described with reference to FIGS. 4 and 7 below. The jitter analyzer 270 may be implemented as any processing circuitry, such as a programmed special purpose or general purpose computer processor, an application specific integrated circuit (ASIC), a digital signal processor (DSP), a field programmable gate array (FPGA), or as a combination of these elements, etc. In some embodiments, the jitter analyzer 270 may be configured to execute instructions from memory 262 or other memory and may perform any methods and/or associated steps indicated by such instructions.

Instrument 200 includes one or more processors 260. Although only one processor 260 is shown in FIG. 2 for ease of illustration, as will be understood by one skilled in the art, multiple processors of varying types may be used in combination, rather than a single processor 260. The one or more processors 260 operate in conjunction with memory 262, which may store instructions for controlling the one or more processors, or data related to the measurement of the test signal or general operation of the instrument 200, or other data. The memory 262 may be implemented as processor cache, random access memory (RAM), read only memory (ROM), solid state memory, hard disk drive(s), or any other memory type. And, although shown as distinct memories 222 and 262, either, both, or other memories may be present throughout the instrument 200. Any data or instructions stored in any of the memories 222, 262, or elsewhere, is also accessible by any component in the instrument 200.

User inputs and interface 280 are coupled to or integrated into the instrument 200. The user input 280 may include a keyboard, mouse, touchscreen, and/or any other controls employable by a user to interact with the instrument 200. A display/output 290 may be a touchscreen display, accepting both user input and providing instrument output. Or, the display/output 290 may be an output only display. The display/output 290 may be a digital screen, computer monitor, or any other monitor to display test results, timestamps, noise levels, jitter, jitter data, or other results to a user as discussed herein. The display/output 290 may also include one or more data outputs that may or may not be correlated with a visual display. The data outputs from the display/output 290 could be sent to a data network, such as a local area network, which may be coupled to a host computer for viewing the data. The display/output 290 may also send data to a remote network, such as a cloud network accessible over the internet by a host computer. While the components of test instrument 200 are depicted as being integrated with test instrument 200, it will be appreciated by a person of ordinary skill in the art that any of these components can be external to test instrument 200 and can be coupled to test instrument 200 in any conventional manner, such as wired and/or wireless communication media and/or other mechanisms.

The instrument 200 may generally include one or more measurement units, not depicted. Such a measurement unit can include any component capable of measuring aspects (e.g., voltage, amperage, amplitude, etc.) of a signal received via the input 220. The instrument 200 may also include conditioning circuits, an analog to digital converter, and/or other circuitry.

Figure 3A:
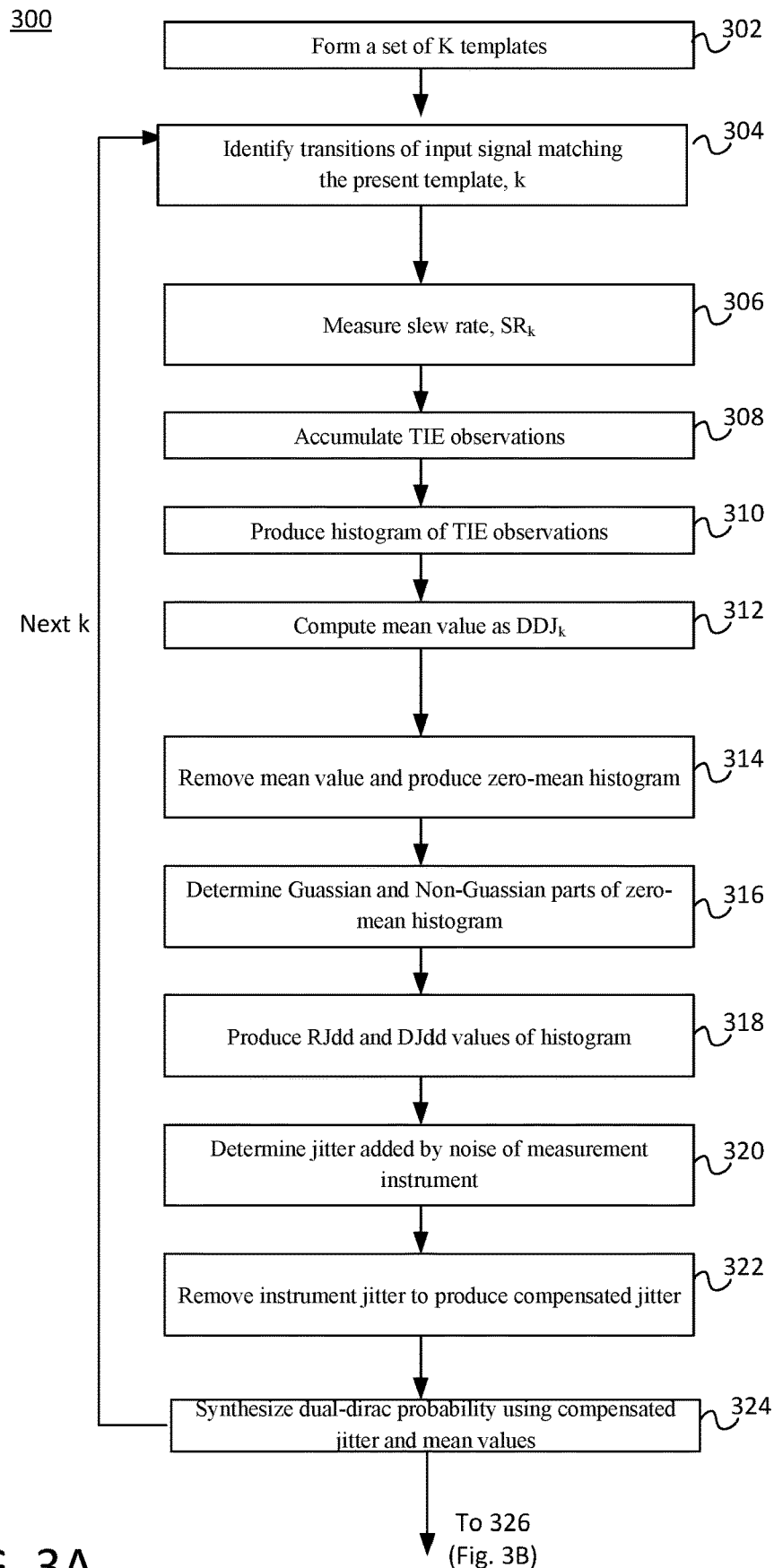
FIGS. 3A and 3B illustrate an example flow diagram describing operations in making a noise-compensated jitter measurement, according to embodiments.
Figure 3B:
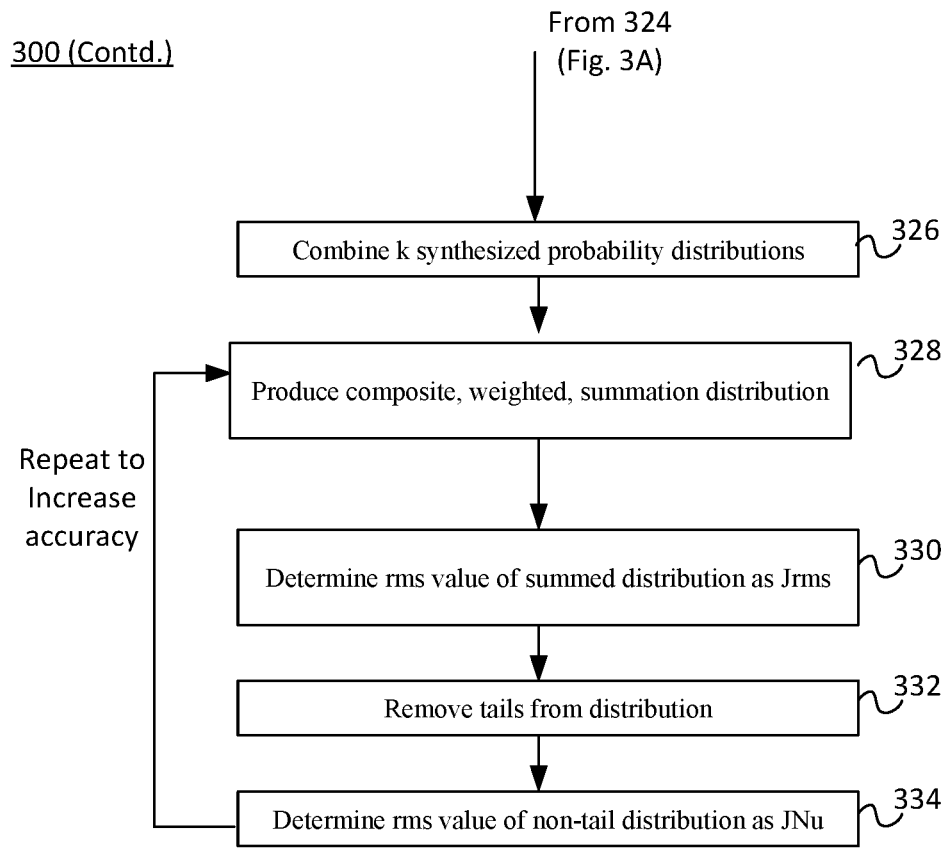

FIGS. 3A and 3B together illustrate an example flow diagram describing operations in a flow 300 for making a noise-compensated jitter measurement, according to embodiments. The operations described in FIGS. 3A and 3B, or elsewhere herein, may be performed by a measurement instrument, such as the instrument 200 of FIG. 2.

A process 300 begins at an operation 302 by forming a set of K templates, where each individual template, k, of the set of K templates defines a target class of transitions within a stream of signals, such as a test signal sent from the DUT 210 in FIG. 2. The templates would typically be formed so as to define mutually exclusive sets of transitions, and typically most or all possible transitions from the PAM-N generator would be represented in one of the templates. The templates may be pre-defined or user defined. FIG. 4 is a block diagram of some components or operations of a jitter processor 400, which may be an embodiment of the noise-compensated jitter analyzer 270 of FIG. 2. In other words, the jitter processor 400 illustrates components, functions, or operations that may be present in the noise-compensated jitter analyzer 270.

Figure 4:
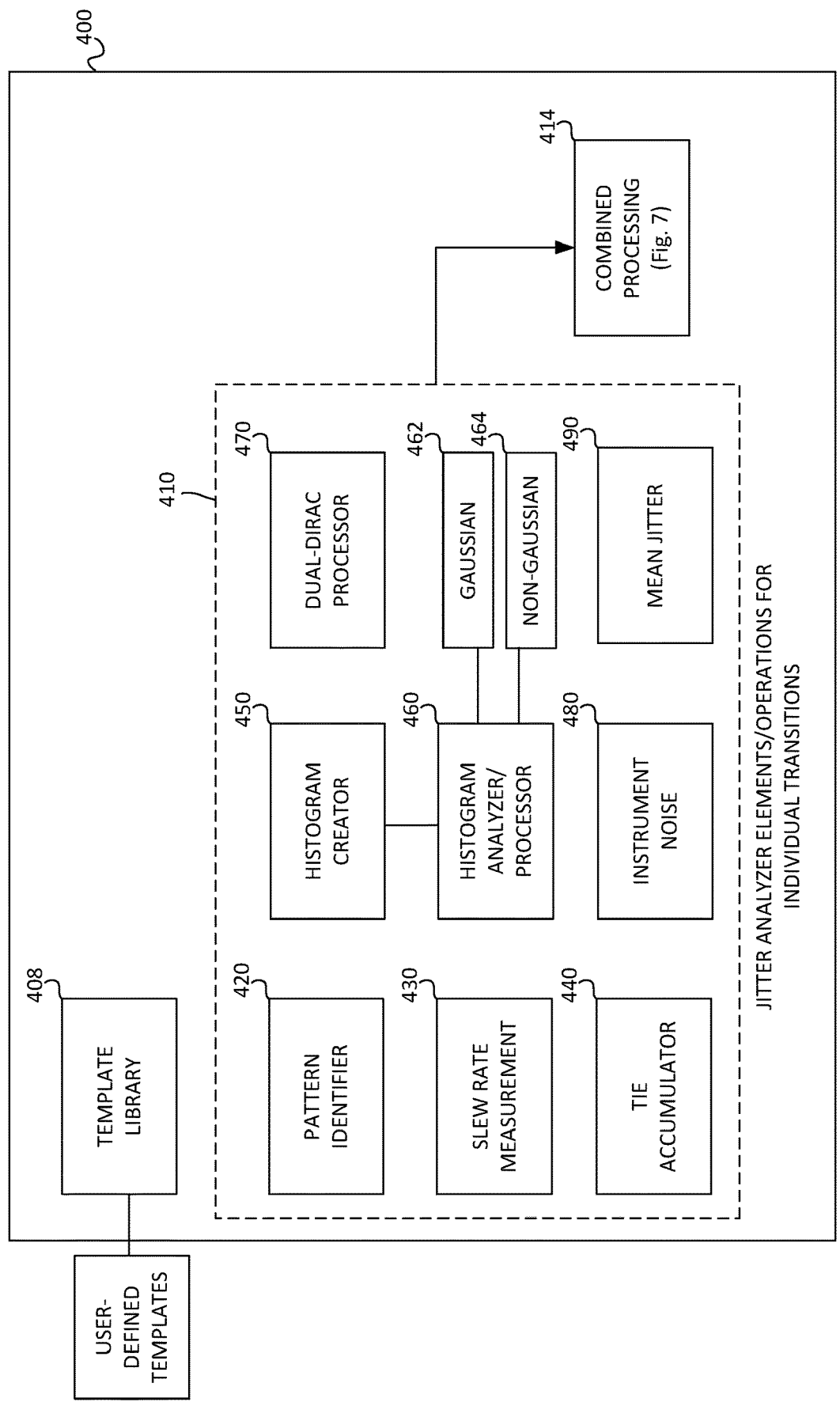
FIG. 4 is an example block diagram illustrating example elements or operations that may be present in a jitter processor of a noise-compensated jitter measurement instrument according to embodiments of the invention.

With reference to FIG. 4, the templates referred to in operation 302 of FIG. 3A may be received from a user, or may be pre-defined and stored in a library of templates 408. An example two-symbol template may identify a particular transition of test data. For example a template [0→3] matches the underlined transition in an example stream of input signals: 1-0-2-0-3-3-0-2. Other templates may include additional symbols, such as [0,0,3], [1,0,3], [2,0,3] and [3,0,3]. Wildcards may be used in some of the templates. Templates may be of any length, which allows the user a great deal of specificity in analyzing the input signal. Templates may also be characterized in different ways, other than received symbols, such as by slew rates.

Next, the process 300 enters a loop that is performed for each of the K transitions defined in operation 302. First, a process 304 identifies and isolates the transitions in the input signal that match the present template k.

Then, for each matched-template transition of the input signal, the mean slew rate is determined in an operation 306. In an operation 308, the TIE observations for all of the present template-matched transitions are accumulated, and then, in an operation 310, a histogram is created from the TIE observations.

With reference to FIG. 4, each of the operations described above may be performed by particular components or operations of the jitter processor 400. Although generally referred to herein as components, one of skill in the art will understand that individual functions described with reference to the jitter processor 400 may be implemented in a combined system operating on one or more processors.

Operations 304, 306, and 308 may be performed by a corresponding component in the jitter processor 400. A template or pattern identifier 420 component may perform operation 304 by selecting the present template, k, from the group of K defined templates for analysis in the waveform being tested. Slew rate measurement of operation 306 may be performed by a slew rate measurement component 430, and the TIE values from operation 308 may be accumulated in a TIE accumulator 440. The histogram referred to in operation 310 may be generated in a histogram creator 450.

A histogram analyzer/processor 460 may be used to perform analysis on the created histogram. For instance, in an operation 312 (FIG. 3A), the histogram analyzer/processor 460 may compute a mean value of the histogram produced in the operation 310. Then, an operation 314 removes this calculated mean value and produces a new histogram, which is a zero-mean histogram.

Next, in an operation 316, the histogram analyzer/processor 460 determines a Gaussian part of the histogram generated in operation 314 and a non-Gaussian part of the histogram. The Gaussian and Non-Guassian processors are illustrated in FIG. 4 as processors 462, 464. The Gaussian part is characterized by a standard deviation, and the non-Gaussian part is characterized by a peak-to-peak part of a dual-dirac model corresponding to the histogram.

Figure 5A:
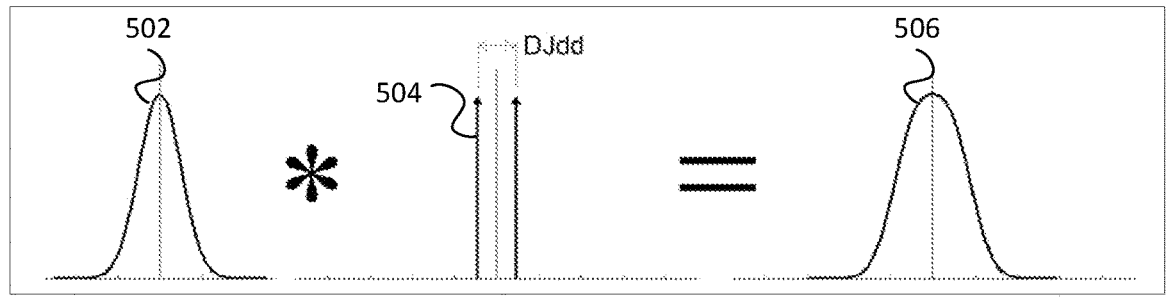
FIGS. 5A, 5B, and 5C illustrate sample, conventional, combinations of Gaussian distributions with a pair of Dirac functions.
Figure 5B:
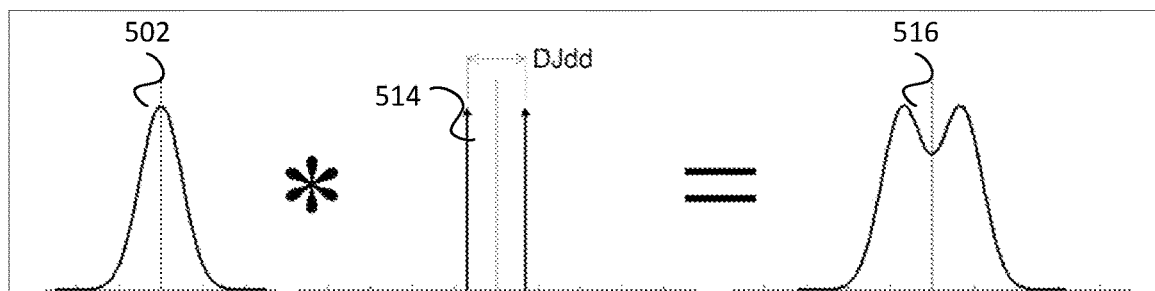
Figure 5C:
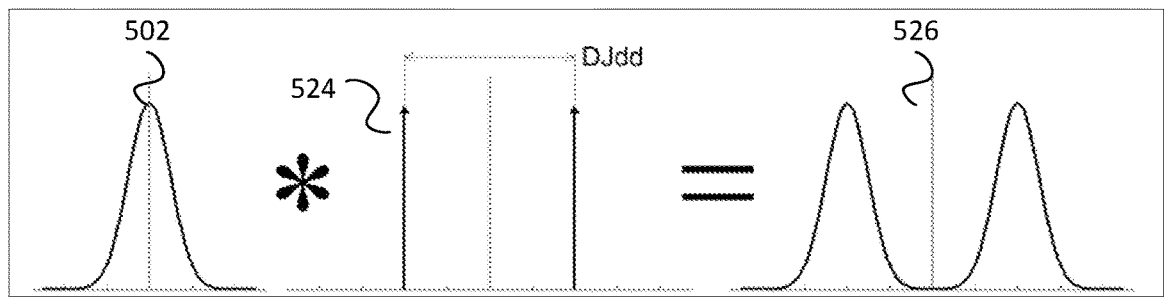

Some examples of curve analysis are illustrated in FIGS. 5A, 5B, and 5C. These figures show three examples of what happens when a Gaussian distribution 502 is combined, or convolved, with a pair of Dirac functions 504, 514, 524 spaced apart by different "DJdd" amounts. The three examples use the same Gaussian sigma 502 but different DJdd values, resulting in three different final distributions 506, 516, and 526. These convolutions may be referred to as a dual-dirac model.

In performing its analysis, the Gaussian processor 462 and Non-Guassian processor 464 may fit a histogram of data, such as the histogram produced in operation 314 to a curve. FIGS. 6A and 6B illustrate an example process of fitting data 602 from an example data histogram to a curve 612. These figures show how, for a given distribution of disparate and discrete data samples 602, formed into a histogram, it is possible to determine a set of dual-dirac parameters $\{\sigma_{RJ}, DJdd\}$ that gives a distribution that best matches, or models, the behavior of the measured data 602, especially in the tails, to produce the curve 612. FIG. 6A illustrates a linear-scale view of the data 602 and curve 612, while FIG. 6B illustrates a log-scale view. The log-scale view of FIG. 6B provides a better view of the match of the measured data 602 to the curve 612 in the "tails" region, i.e., at either end of the curve, furthest away from the center. Those skilled in the art will appreciate that q-scale analysis is one known approach for creating such a model, although other approaches may also be used.

Referring back to FIG. 3A, in an operation 318 the Gaussian processor 462 and Non-Gaussian processor 464, in conjunction with a dual-dirac processor 470, produce the RJdd sigma value and a DJdd value from the histogram generated in operation 314. From these and other values observed in the instrument 200, an operation 320 determines an effective Random Jitter due to the noise introduced by the instrument itself, using Equation 5, above. Note that this Random Jitter due to the instrument noise is determined on an individual template basis, i.e., for only the portions of the input waveform that match the present template description k. In subsequent loops, the process 300 determines the Random Jitter for input data matching the other templates as well. The component of the jitter due to instrument noise may be determined by or in conjunction with an instrument noise component 480 of the jitter processor 400 of FIG. 4.

In an operation 322, the Random Jitter determined in the operation 320 is removed from RJdd, using Equation 7, above, to produce a compensated RJdd. This compensated RJdd is referred to as $RJdd_{comp}$. Next, the jitter processor 400 synthesizes, to a high resolution, a dual-dirac probability distribution using $RJdd_{comp}$, determined in operation 322, as well as the DJdd values determined in operation 312. The tails of the jitter represented by this dual-dirac model are not necessarily limited to probabilities or populations present in the actual jitter observations.

The operations 304-324 of flow 300 then repeat for the next template k in the series of K templates described with reference to operation 302 above. With reference to FIG. 4, the components of the jitter processor 400 that perform the operations of flow 300 are illustrated as a group of components 410, to illustrate that a portion of the jitter processor 400 operates on a subset of data, defined by the templates or class definitions, and another component 414 of the jitter processor 400 operates on the sum of the data generated by the group of components 410.

Figure 7:
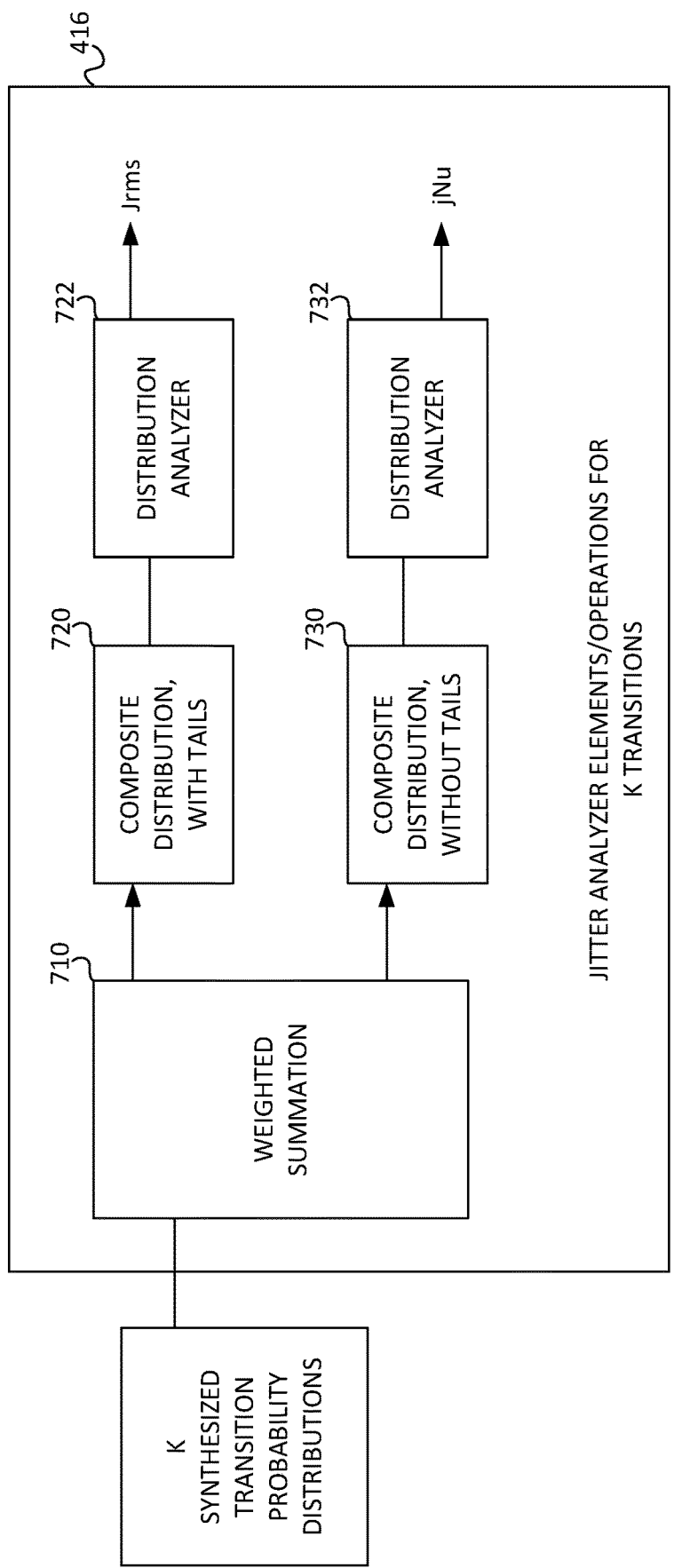
FIG. 7 is an example block diagram illustrating additional example elements or operations that may be present in a jitter processor of a noise-compensated jitter measurement instrument according to embodiments of the invention.

With references to FIGS. 3B and 7, next described are operations and components that are further used to produce noise-compensated jitter, according to embodiments of the invention. The flow 300 from FIG. 3A continues into an operation 326, illustrated in FIG. 3B. Operation 326 combines the synthesized probability distribution functions produced in operation 324 for each of the templates, k, in the set of K templates. In other words, in the operation 326, the probability function produced in the operation 324 for k=1 is added to the probability function produced in the operation 324 for k=2, and this process repeats for all of the templates, k, in the set of K templates. This combination may be performed by a summation component 710 (FIG. 7), which is a part of the jitter processor 400 of FIG. 4. Specifically, the combined processing 416 referred to in FIG. 4 receives the output from all of the K distributions, or histograms from the group of components 410. The summation component 710 creates, in an operation 328, a composite distribution that is no longer in dual-dirac form, but the composite distribution does include tails, i.e., those areas of the distribution furthest from the center. The tails of the composite distribution can reasonably be extrapolated well beyond the actual population of data that was analyzed in the flow 300 of FIG. 3A.

From a composite distribution with tails, illustrated as 720, a distribution analyzer 722 generates an rms value in an operation 330, which is produced as Jrms. A composite distribution without tails is created in an operation 332, and illustrated as 730, by excluding the tail portion of the distribution created for 720. Excluding the tail portions of a distribution function was described above. From the distribution without tails 730, a distribution analyzer 732 produces a range of the minimum and maximum jitter values in an operation 334, which is recorded as J6u.

Once the Jrms and JNu parameters have been generated, Equations (1)-(3) may be used to generate various jitter parameters equivalent to Jrms and J6u. Other equivalent parameters may also be generated, using other equations, depending on the particular parameters reported.

To increase the accuracy of the jitter measurements described herein, operations of FIGS. 3A and 3B may be repeated with other sample populations from the DUT to increase the populations of each of the K histograms.

Given the flexibility embodiments of the invention provide in producing templates, the measurement instrument of user has a large amount of control in specifying exactly which data transitions from a DUT 210 will be used in a particular analysis.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement device including an input for receiving a test waveform from a Device Under Test (DUT), where the test waveform has a plurality of input level transitions, a selector structured to respectively and individually extract only those portions of the test waveform that match two or more predefined patterns of input level transitions of the test waveform, a noise compensator structured to individually determine and remove, for each of the extracted portions of the waveform, a component of a jitter measurement caused by random noise of the test and measurement device receiving the test waveform, a summer structured to produce a composite distribution of timing measurements with removed noise components from the extracted portions of the test waveform, and a jitter processor structured to determine a first noise-compensated jitter measurement of the DUT from the composite distribution.

Example 2 is a test and measurement device according to Example 1, in which the summer is structured to exclude tails of the composite distribution to produce a center composite distribution, and in which the jitter processor is further structured to determine a second noise-compensated jitter measurement of the DUT from the center composite distribution.

Example 3 is a test and measurement device according to Example 2, in which the first noise-compensated jitter measurement is Jrms and in which the second noise-compensated jitter measurement is JNu.

Example 4 is a test and measurement device according to any of the preceding Examples, in which a slew rate of transitions that match the first predefined pattern of the test waveform is different than a slew rate of transitions that match the second predefined pattern of the test waveform.

Example 5 is a test and measurement device according to any of the preceding Examples, in which the noise compensator is structured to fit a histogram of a set of timing data of the extracted portions of the test waveform that match one of the predefined patterns to a curve.

Example 6 is a test and measurement device according to Example 5, in which the noise compensator is structured to fit the histogram of the set of timing data to the curve based on properties of the q-scale.

Example 7 is a test and measurement device according to Example 6, in which the curve is a probability distribution corresponding to a dual-dirac model.

Example 8 is a method for determining a jitter measurement of an input signal, the jitter measurement compensated for noise caused by an instrument structured to receive the input signal, the Example method including receiving the input signal at the instrument from a Device Under Test (DUT), producing a test waveform from the received input signal, selecting two or more portions of the test waveform that respectively match two or more predefined patterns of the input signal, for each of the two or more selected portions, individually determining a component of jitter caused by instrument noise and individually synthesizing a histogram of timing measurements that compensates for the instrument noise, summing the noise-compensated histograms of timing measurements of the two or more selected portions to produce a composite probability distribution, and determining a noise-compensated jitter measurement of the DUT from the composite probability distribution.

Example 9 is a method according to Example 8, in which individually determining a component of jitter caused by instrument noise includes, for each of the selected two or more portions of the test waveform: producing a raw histogram of timing errors of the selected portion of the test waveform, removing a mean value of the timing errors from the raw histogram, and producing a zero-mean histogram, and performing a dual-dirac analysis to fit the zero-mean histogram to determine Gaussian and Non-Gaussian parts of the zero-mean histogram.

Example 10 is a method according to Example 9, further comprising for each of the selected two or more portions of the test waveform: deriving dual-dirac deterministic jitter from the zero-mean histogram, and deriving random jitter from the zero-mean histogram.

Example 11 is a method according to Example 10 further comprising, for each of the selected two or more portions of the test waveform: determining a random jitter component added by an effect of a mean slew rate of the selected portion of the test waveform on the random noise of the instrument, and removing the added random jitter component to produce a compensated random jitter component for the selected portion of the test waveform.

Example 12 is a method according to Example 11, further comprising, for each of the selected two or more portions of the test waveform, synthesizing a compensated dual-dirac model of the selected portion of the test waveform by convolving the compensated random jitter component with the dual-dirac deterministic jitter from the zero-mean histogram.

Example 13 is a method according to any of the above Example methods, in which summing the noise-compensated histograms of timing measurements comprises performing a weighted summing of the noise-compensated histograms of timing measurements of the two or more selected portions based at least in part on a relative number of transitions of the input signal in each of the two or more selected portions.

Example 14 is a method according to any of the above Example methods, further comprising excluding tails of the combined probability distribution to produce a center summed distribution, and determining a noise-compensated jitter value from the center summed distribution.

Example 15 is a test and measurement device, including an input for receiving an input signal from a Device Under Test (DUT) and creating a test waveform from the received input signal, one or more processors configured to execute code to cause the one or more processors to determine jitter in the input signal that is compensated for noise caused by a device receiving the input signal by receiving the input signal at the receiving device, producing a test wavefom from the received input signal, selecting two or more portions of the test waveform that respectively match two or more predefined patterns of the input signal, for each of the two or more selected portions, individually determining a component of jitter caused by instrument noise and individually synthesizing a histogram of timing measurements that compensates for the instrument noise, summing the noise-compensated histograms of timing measurements of the two or more selected portions to produce a composite probability distribution, and determining a noise-compensated jitter measurement of the DUT from the composite probability distribution.

Example 16 is a test and measurement device according to Example 15, in which individually determining a component of jitter caused by instrument noise includes, for each of the selected two or more portions of the test waveform: producing a raw histogram of timing errors of the first portion of the test waveform, removing a mean value of the timing errors from the raw histogram, and producing a zero-mean histogram, and performing a dual-dirac analysis to fit the zero-mean histogram to determine Gaussian and Non-Gaussian parts of the zero-mean histogram.

Example 17 is a test and measurement device according to Example 16, in which the one or more processors are further configured to derive dual-dirac deterministic jitter from the zero-mean histogram, and derive random jitter from the zero-mean histogram.

Example 18 is a test and measurement device according to Example 17, in which the one or more processors are further configured to, for each of the selected two or more portions of the test waveform, determine a random jitter component added by an effect of a mean slew rate of the selected portion of the test waveform on the random noise of the receiving device, and remove the added random jitter component to produce a compensated random jitter component for the selected portion of the test waveform.

Example 19 is a test and measurement device according to any of the Examples 15-18, in which the one or more processors are further configured to, for each of the selected two or more portions of the test waveform, synthesize a compensated dual-dirac model of the selected portion of the test waveform by convolving the compensated random jitter component with the dual-dirac deterministic jitter from the zero-mean histogram.

Example 20 is a test and measurement device according to Example 19, in which the one or more processors are further configured to sum the noise-compensated histograms of timing measurements by performing a weighted summing of the noise-compensated histograms of timing measurements of the two or more selected portions based at least in part on a relative number of transitions of the input signal in each of the two or more selected portions.

Example 21 is a test and measurement device according to any of the Examples 15-20, in which the one or more processors are further configured to exclude tails of the combined probability distribution to produce a center summed distribution, and determine a noise-compensated jitter value from the center summed distribution.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:
1. A test and measurement device, comprising:
an input for receiving a test waveform from a Device Under Test (DUT), the test waveform having a plurality of input level transitions;
a selector structured to respectively and individually extract only those portions of the test waveform that match two or more predefined patterns of input level transitions of the test waveform;
a noise compensator structured to individually determine and remove, for each of the extracted portions of the waveform, a noise component of a jitter measurement caused by random noise of the test and measurement device receiving the test waveform;
a summer structured to produce a composite distribution of timing measurements with the removed noise components from the extracted portions of the test waveform; and
a jitter processor structured to determine a first noise-compensated jitter measurement of the DUT from the composite distribution.

2. The test and measurement device of claim 1, in which the summer is structured to exclude tails of the composite distribution to produce a center composite distribution, and in which the jitter processor is further structured to determine a second noise-compensated jitter measurement of the DUT from the center composite distribution.

3. The test and measurement device of claim 2, in which the first noise-compensated jitter measurement is Jrms and in which the second noise-compensated jitter measurement is JNu.

4. The test and measurement device according to claim 1, in which a slew rate of transitions that match the first predefined pattern of the test waveform is different than a slew rate of transitions that match the second predefined pattern of the test waveform.

5. The test and measurement device according to claim 1, in which the noise compensator is structured to fit a histogram of a set of timing data of the extracted portions of the test waveform that match one of the predefined patterns to a curve.

6. The test and measurement device according to claim 5, in which the noise compensator is structured to fit the histogram of the set of timing data to the curve based on properties of the q-scale.

7. The test and measurement device according to claim 5, in which the curve is a probability distribution corresponding to a dual-dirac model.

8. A method for determining a jitter measurement of an input signal, the jitter measurement compensated for noise caused by an instrument structured to receive the input signal, the method comprising:
receiving the input signal at the instrument from a Device Under Test (DUT);
producing a test waveform from the received input signal;
selecting two or more portions of the test waveform that respectively match two or more predefined patterns of the input signal;
for each of the two or more selected portions, individually determining a component of jitter caused by instrument noise and individually synthesizing a histogram of timing measurements that compensates for the instrument noise;
summing the noise-compensated histograms of timing measurements of the two or more selected portions to produce a composite probability distribution; and
determining a noise-compensated jitter measurement of the DUT from the composite probability distribution.

9. The method for determining a jitter measurement according to claim 8, in which individually determining a component of jitter caused by instrument noise includes, for each of the selected two or more portions of the test waveform:
producing a raw histogram of timing errors of the selected portion of the test waveform;
removing a mean value of the timing errors from the raw histogram, and producing a zero-mean histogram; and
performing a dual-dirac analysis to fit the zero-mean histogram to determine Gaussian and Non-Gaussian parts of the zero-mean histogram.

10. The method for determining a jitter measurement according to claim 9, further comprising for each of the selected two or more portions of the test waveform:
deriving dual-dirac deterministic jitter from the zero-mean histogram; and
deriving random jitter from the zero-mean histogram.

11. The method determining a jitter measurement according to claim 10, further comprising, for each of the selected two or more portions of the test waveform:
determining a random jitter component added by an effect of a mean slew rate of the selected portion of the test waveform on the random noise of the instrument; and
removing the added random jitter component to produce a compensated random jitter component for the selected portion of the test waveform.

12. The method determining a jitter measurement according to claim 11, further comprising, for each of the selected two or more portions of the test waveform, synthesizing a compensated dual-dirac model of the selected portion of the test waveform by convolving the compensated random jitter component with the dual-dirac deterministic jitter from the zero-mean histogram.

13. The method determining a jitter measurement according to claim 8, in which summing the noise-compensated histograms of timing measurements comprises performing a weighted summing of the noise-compensated histograms of timing measurements of the two or more selected portions based at least in part on a relative number of transitions of the input signal in each of the two or more selected portions.

14. The method for determining a jitter measurement according to claim 8, further comprising:
excluding tails of the combined probability distribution to produce a center summed distribution; and
determining a noise-compensated jitter value from the center summed distribution.

15. A test and measurement device, comprising:
an input for receiving an input signal from a Device Under Test (DUT) and creating a test waveform from the received input signal; and
one or more processors configured to execute code to cause the one or more processors to determine jitter in the input signal that is compensated for noise caused by a device receiving the input signal by:
receiving the input signal at the receiving device;
producing a test waveform from the received input signal;
selecting two or more portions of the test waveform that respectively match two or more predefined patterns of the input signal;
for each of the two or more selected portions, individually determining a component of jitter caused by instrument noise and individually synthesizing a histogram of timing measurements that compensates for the instrument noise;
summing the noise-compensated histograms of timing measurements of the two or more selected portions to produce a composite probability distribution; and
determining a noise-compensated jitter measurement of the DUT from the composite probability distribution.

16. The test and measurement device of claim 15, in which individually determining a component of jitter caused by instrument noise includes, for each of the selected two or more portions of the test waveform:
producing a raw histogram of timing errors of the first portion of the test waveform;
removing a mean value of the timing errors from the raw histogram, and producing a zero-mean histogram; and
performing a dual-dirac analysis to fit the zero-mean histogram to determine Gaussian and Non-Gaussian parts of the zero-mean histogram.

17. The test and measurement device of claim 16, in which the one or more processors are further configured to:
derive dual-dirac deterministic jitter from the zero-mean histogram; and derive random jitter from the zero-mean histogram.

18. The test and measurement device of claim 17, in which the one or more processors are further configured to, for each of the selected two or more portions of the test waveform:
   determine a random jitter component added by an effect of a mean slew rate of the selected portion of the test waveform on the random noise of the receiving device; and
   remove the added random jitter component to produce a compensated random jitter component for the selected portion of the test waveform.

19. The test and measurement device of claim 15, in which the one or more processors are further configured to, for each of the selected two or more portions of the test waveform, synthesize a compensated dual-dirac model of the selected portion of the test waveform by convolving the compensated random jitter component with the dual-dirac deterministic jitter from the zero-mean histogram.

20. The test and measurement device of claim 19, in which the one or more processors are further configured to sum the noise-compensated histograms of timing measurements by performing a weighted summing of the noise-compensated histograms of timing measurements of the two or more selected portions based at least in part on a relative number of transitions of the input signal in each of the two or more selected portions.

21. The test and measurement device of claim 15, in which the one or more processors are further configured to:
   exclude tails of the combined probability distribution to produce a center summed distribution; and
   determine a noise-compensated jitter value from the center summed distribution.

* * * * *